(12) United States Patent
Kliorin

(10) Patent No.: US 6,219,659 B1
(45) Date of Patent: Apr. 17, 2001

(54) CONFIGURATION DESCRIPTION LANGUAGE SYSTEM

(75) Inventor: Victor Kliorin, Foster City, CA (US)

(73) Assignee: Electronics for Imaging, Inc., Foster City, CA (US)

( * ) Notice: Subject to any disclaimer, the term of this patent is extended or adjusted under 35 U.S.C. 154(b) by 0 days.

(21) Appl. No.: 09/112,072

(22) Filed: Jul. 8, 1998

(51) Int. Cl.[7] .................................................. G06F 17/00
(52) U.S. Cl. ................................ 706/47; 706/45; 706/46
(58) Field of Search ............................... 706/59–61, 45, 706/47; 707/100, 102, 200, 1, 104

(56) References Cited

U.S. PATENT DOCUMENTS

| 4,558,413 |   | 12/1985 | Schmidt et al. ...................... 364/300 |
| 4,688,195 |   | 8/1987  | Thompson et al. .................. 364/300 |
| 4,787,035 |   | 11/1988 | Bourne ................................. 364/300 |
| 4,809,170 | * | 2/1989  | Leblang et al. ......................... 717/3 |
| 4,924,408 | * | 5/1990  | Highland ............................... 706/60 |
| 5,260,866 |   | 11/1993 | Lisinski et al. ...................... 364/401 |
| 5,295,230 | * | 3/1994  | Kung ...................................... 706/59 |
| 5,303,332 | * | 4/1994  | Kirk et al. ............................. 706/50 |
| 5,339,435 | * | 8/1994  | Lubkin etal. ......................... 717/11 |
| 5,500,802 |   | 3/1996  | Morris et al. .................... 364/474.24 |
| 5,546,507 | * | 8/1996  | Staub .................................... 706/60 |

(List continued on next page.)

FOREIGN PATENT DOCUMENTS

| 0399822 A2 | 11/1990 | (EP) ................................ G06F/9/44 |
| WO 91/00576 | 1/1991 | (WO) ............................ G06F/15/21 |
| WO 96/02882 | 2/1996 | (WO) ............................. G06F/9/44 |
| WO 97/15886 | 5/1997 | (WO) ........................... G06F/15/177 |

OTHER PUBLICATIONS

Beeri, "New data models and languages the chanllenge", ACM PDS, pp 1–15, Jun. 1992.*
Atherton et al, "A probabilistic model for natural language understanding", ACM SAC pp 586–592, Feb. 1993.*
Ohori et al, "Semantics for communication primitives in polymorphic language", ACM POPL pp 99–112, May 1993.*
Jaffar et al, "The CLP(r) language and system", ACM Trans. Prog. Lang. & System. vol. 14, No. 3, pp 339–395, Jun. 1992.*

*Primary Examiner*—Mark Powell
*Assistant Examiner*—Anil Khatri
(74) *Attorney, Agent, or Firm*—Michael A. Glenn

(57) ABSTRACT

A configuration description language system in a computer environment provides a mechanism to develop sets of rules intended to govern computing systems. A custom language is provided that the system designer uses to describe constraints and rules of target systems where a rule describes how a certain set of parameters of a computing system are determined based on an input set of desired characteristics. The desired characteristics pertain to certain tasks that the user wants to apply to such a system. The parameters (or constraints) are based upon system limitations such as memory configuration, processor speed and model number. The system designer creates rule sets using the custom language and compiler. The compiler ensures that the sets are complete and unambiguous and converts the custom language into a binary format that is compact, portable, and suitable for efficient searches, thereby minimizing execution times. A report tool is provided for the designer to verify the system's parameters and traverses all of the rule sets and creates a table of all possible combinations of options or characteristics of the target system. The resulting rule database is then read using a database manager which applies the set of rules in the rule database to input jobs or choices that the user makes. Any desired characteristics that are not available or feasible in the target system are replaced with characteristics that do make sense with respect to the target system. The output from the database manager is a corrected or constrained set of choices. This allows the rule database and the database manager to be installed in a product internally or used as a front-end to a target system, thereby providing corrected input to the target system.

9 Claims, 8 Drawing Sheets

U.S. PATENT DOCUMENTS

| | | | |
|---|---|---|---|
| 5,574,898 | * 11/1996 | Leblang et al. | 707/1 |
| 5,630,125 | 5/1997 | Zellweger | 395/614 |
| 5,649,200 | * 7/1997 | Leblang et al. | 717/3 |
| 5,708,798 | * 1/1998 | Lynch et al. | 703/1 |
| 5,809,492 | * 9/1998 | Murray et al. | 706/45 |
| 5,835,683 | * 11/1998 | Corella et al. | 706/59 |
| 5,943,673 | * 8/1999 | Felouzis | 707/104 |
| 6,041,347 | * 3/2000 | Harsham et al. | 709/220 |

* cited by examiner

CONFIGURATION DESCRIPTION LANGUAGE SYSTEM

BACKGROUND OF THE INVENTION

1. Technical Field

The invention relates to the creation of rules for computing systems in a computer environment. More particularly, the invention relates to the creation of rules describing the characteristics of a computing system in a computer environment.

2. Description of the Prior Art

Computing systems that make decisions using rules are typically difficult to maintain during product lifetimes as a product matures and changes. Release engineering has always been concerned with the ability to recreate prior releases of product code bases consistently and accurately.

Generally, the design engineer must create tables of rules by hand. These tables are placed in files. The tables are then modified manually each time a product changes or options are added. Problems commonly occur whenever a table is modified because mistakes are made when another design engineer is unfamiliar with all of the possible options in a product and makes the modifications. Systems crash in the field because of improper characteristics that were defined in a product and not discovered before shipping.

Languages such as C, C++, and Postscript are used to define the tables described above. The definitions are generally inconsistent and difficult to understand. Currently, these tables are verified by having the design engineer walk through the rules manually to discover any inconsistencies or to test the product by inputting a multitude of option combinations.

It would be advantageous to provide a configuration description language system that gives the user the ability to easily describe a computing system's characteristics and immediately verify the validity of the rules dictating those characteristics. It would further be advantageous to provide a configuration description language system that is can be applied to diverse products and is easily maintained through ease of use and development tool commonality.

SUMMARY OF THE INVENTION

The invention provides a configuration description language system. The invention provides an intuitive, easily understood, and maintained configuration language that allows a user to define the characteristics of a computing system in a computer environment. A compiler is provided to verify the correctness of the computing system's characteristics and convert the rules into a compact, portable, and easy to search binary format. In addition, the invention provides a database manager that accepts desired characteristics as input and outputs characteristics that have been corrected according to the rules created by the user.

A preferred embodiment of the invention provides a mechanism to develop sets of rules intended to govern computing systems. A custom language is provided that the system designer uses to describe constraints and rules of target systems.

A rule describes how a certain set of parameters of a computing system are determined based on an input set of desired characteristics. The desired characteristics pertain to certain tasks that the user wants to apply to such a system. The parameters (or constraints) are based upon system limitations such as memory configuration, processor speed, model number, etc.

The system designer creates rule sets using the custom language and compiler. The language is well suited to be easily written and read by human beings which facilitates easy verification of the correctness of the rules describing the target system. The compiler ensures that the sets are complete and unambiguous. It converts the custom language into a binary format that is compact, portable, and suitable for efficient searches, thereby minimizing execution times.

A report tool is provided for the designer to verify the system's parameters. The report tool traverses all of the rule sets and creates a table of all possible combinations of options or characteristics of the target system. The resulting rule database is then read using a database manager.

The database manager applies the set of rules in the rule database to input jobs or choices that the user makes. Any desired characteristics that are not available or feasible in the target system are replaced with characteristics that do make sense with respect to the target system. The output from the database manager is a corrected or constrained set of choices. This allows the rule database and the database manager to be installed in a product internally or used as a front-end to a target system, thereby providing corrected input to the target system.

Users typically do not have a thorough understanding of what a target system can or cannot do. The invention corrects user input automatically. Any combination of input can be understood and converted once the constraints or rules are defined. The invention works with any computing system that can be described in a closed set or defined space.

Other aspects and advantages of the invention will become apparent from the following detailed description in combination with the accompanying drawings, illustrating, by way of example, the principles of the invention.

DETAILED DESCRIPTION OF THE INVENTION

Figure 1:
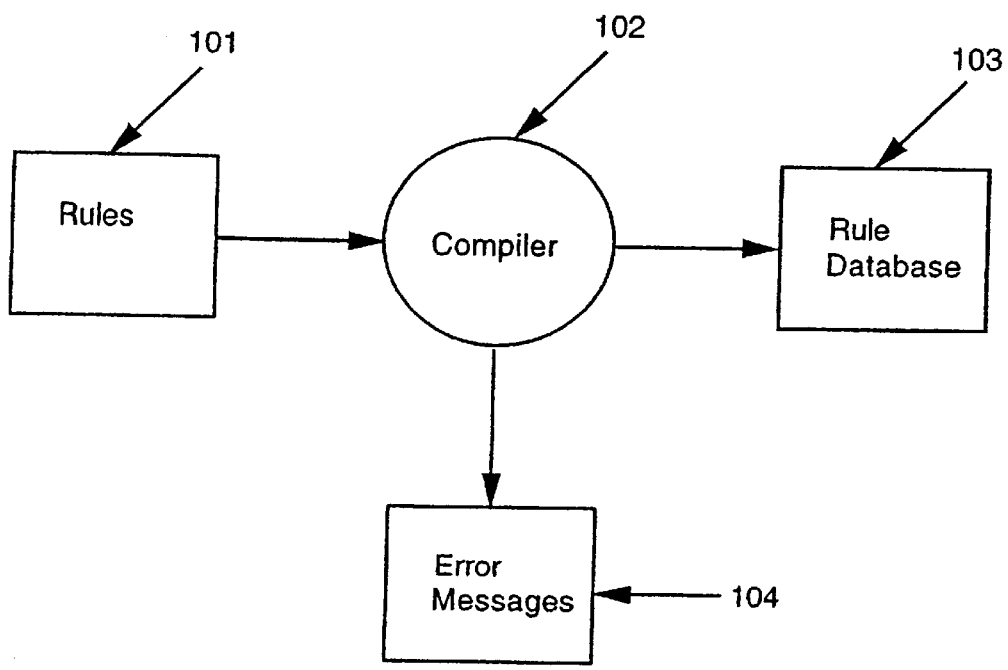
FIG. 1 is a block schematic diagram of the process of compiling a rule set according to the invention.

The invention is embodied in a configuration description language system for computer applications. A system according to the invention provides an unambiguous language for describing the characteristics of a target system and a compiler to verify the validity of any definitions, thereby providing an easily maintainable, consistent, and reproducible system definition. The compiler converts the system definition into a binary format that is portable, compact and easily searched. Many existing approaches make it difficult for the user to consistently reproduce databases that describe a system's characteristics and maintain these databases across a product's lifetime.

A preferred embodiment of the invention provides a mechanism to develop sets of rules intended to govern computing systems. A custom language is provided that the system designer uses to describe constraints and rules of target systems.

A rule describes how a certain set of parameters of a computing system are determined based on an input set of desired characteristics. The desired characteristics pertain to certain tasks that the user wants to apply to such a system. The parameters (or constraints) are based upon system limitations such as memory configuration, processor speed, model number, etc.

The system designer creates rule sets using the custom language and compiler. The language is well suited to be easily written and read by human beings which facilitates easy verification of the correctness of the rules describing the target system. The compiler ensures that the sets are complete and unambiguous. It converts the custom language into a binary format that is compact, portable, and suitable for efficient searches, thereby minimizing execution times.

The language introduces two concepts: base and derived parameters. Some parameters in a system are user-configurable and are called base parameters. Other parameters are selected depending on values of base parameters, these are called derived parameters.

The target system or rule database defines the relationship between base and derived parameters. It is conceptually a table that has two sets of columns; one column for base and one for derived parameters. Several concepts are employed to make the task of building the rule set as simple as possible as well as to make it work for a variety of applications:

1. The sets of base and derived parameters are decomposed into several equivalent subsets. This concept is implemented in the language as support of multiple tables.
2. The language supports ranges of parameters and rule templates to make the description of the set more concise.
3. The compiler analyzes the description to find omissions, redundancies and ambiguities and alerts the system designer of them through error messages.
4. The language allows for specifying arbitrary sets of types of parameters and values of types of parameters.

The following is a description of the language presented in a pseudo-Backus-Naur Form (BNF):

The keywords of the language are:

```
K_ALIAS    alias
K_BASE     base
K_DEFAULT  default
K_DERIVED  derived
K_FORM     form
K_OPTION   option
K_RULE     rule
K_TABLE    table
K_TEMPLATE template
K_TYPE     type
```

Two additional tokens used in BNFs are described below in terms of lex semantics:

```
T_QSTR  (\"[^\"\r\n]*[\"\r\n])
T_ID    ([[:alpha:]_][[:alnum:]_]*)
file
    :/* nothing */
    |statement_list
    ;
statement_list
    :statement
    |statement_list statement
    ;
statement
    :K_TABLE known_id
     '{' opt table_decl_list '}'
    |K_FORM new_id '{' type_list ':' type_list '}'
    |K_TYPE K_BASE id_decl_list';'
    |K_TYPE K_DERIVED K_BASE id_decl_list';'
    |K_TYPE K_DERIVED id_decl_list';'
    |K_ALIAS new_id option';'
    |K_OPTION known_id id_decl list';'
    |K_DEFAULT known_id_pair_list';'
    ;
opt_table_decl_list
    :/*nothing*/
    |table_decl_list
    ;
table_decl_list
    :table_decl
    |table_decl_list table_decl
    ;
table_decl
    :K_RULE rule_body
    |K_RULE K_TEMPLATE table_known_id rule_body
    |K_RULE K_TEMPLATE table_known_id';'
    |K_TEMPLATE table_local_id rule_body
    |K_TEMPLATE table_local_id ':' table_known_id
rule_body
    ;
rule_body
    :'{' opt_option_op list ':' opt_option_op_list '}'
    ;
option
    :'{' known_id_list '}'
    |known_id
    ;
opt_option_op_list
    :/*empty*/
    |option_op_list
    ;
option_op_list
    :option_op
    |option_op_list option_op
    ;
option_op
    : '+' option
    |option
    | '-' option
    ;
id_decl_list
    :id_decl
    |id_decl_list';'id_decl
    ;
known_id_list
    :known_id
    |known_id_list known_id
    ;
known_id_pair
    :known_id '=' known_id
known_id_pair_list
    :known_id_pair
    |known_id_pair_list ',' known_id_pair
    ;
type_list
    :known_id
    |type_list known_id
    ;
```

-continued

```
id_decl
   :new_id
   |new id '=' T_QSTR
   ;
new_id
   :T_ID
   ;
known_id
   :T_ID
   ;
table_known_id
   :T_ID
   ;
table_local_id
   :T_ID
   ;
```

Referring to FIG. 1, the compiler module 102 takes the rule sell 101 that the system designer has created from the target system definitions and validates the base and derived parameters for completeness. The rule set 101 is written in the language defined above. If any inconsistencies or errors exist, the compiler 102 notifies the designer by issuing error messages 104. If no errors exist, then the compiler will create a binary form of the rule set 101, called the rule database 103.

Figure 2:
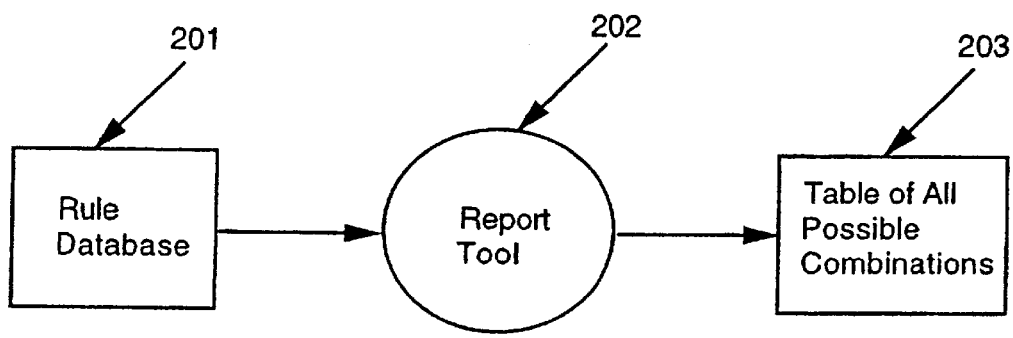
FIG. 2 is a block schematic diagram of the functionality of the report tool module according to the invention.

With respect to FIG. 2, a report tool module 202 is provided for the designer to verify the system's parameters. The report tool 202 traverses all of the rule sets in the rule database 201 and creates a table of all possible combinations of options or characteristics of the target system 203.

Figure 3:
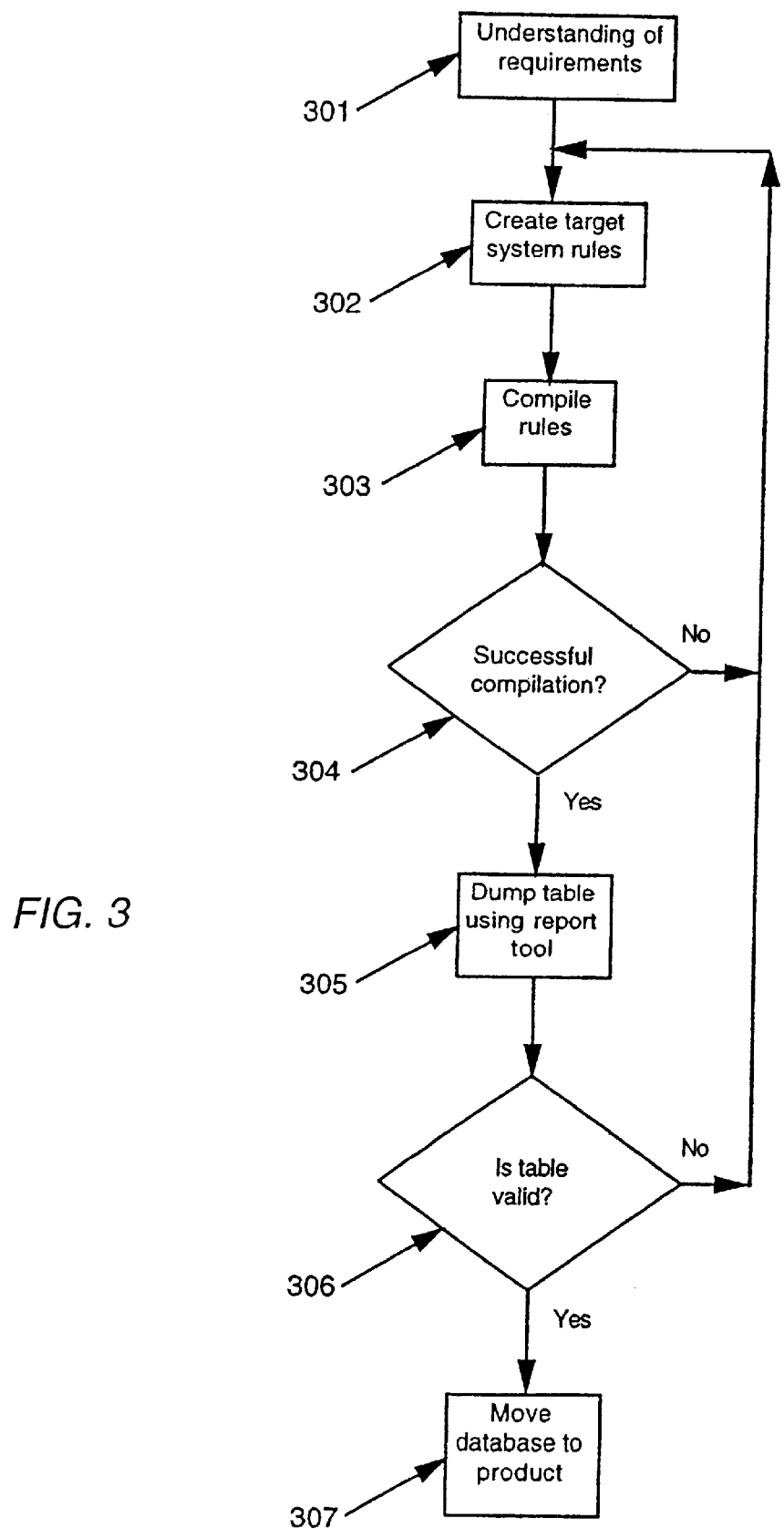
FIG. 3 is a block schematic diagram of the flow of an engineering process using the compiler and report tool modules according to the invention.

The system designer uses the compiler and report tools to verify his design. Referring to FIG. 3, an example of an engineering process is shown where the designer first works from the system requirements of the target system 301 to define the rule set 302. The designer then compiles the rule set 303. If any errors occur 304, the designer then goes back and corrects the rule set 302 and performs the process once again.

If no errors in the compilation occur 304, then the designer has a rule database that he uses with the report tool to dump a table containing all of the possible combinations of characteristics according to the rule sets 305. He then validates the table by manually checking if any of the combinations do not make sense with respect to the target system 306. If any of the combinations are incorrect 306, the designer goes back and rewrites the rules to add or eliminate certain constraints 302 and then walks through the process again. If the designer finds that the table is valid 306, then he moves the rule database into the target product 307.

Maintainability is assured through the automatic process in which the database is produced. The main concern in release engineering has always been the accurate reproduction of prior releases. The invention gives release engineers a consistent, reproducible method to create rule databases for products.

Figure 4:
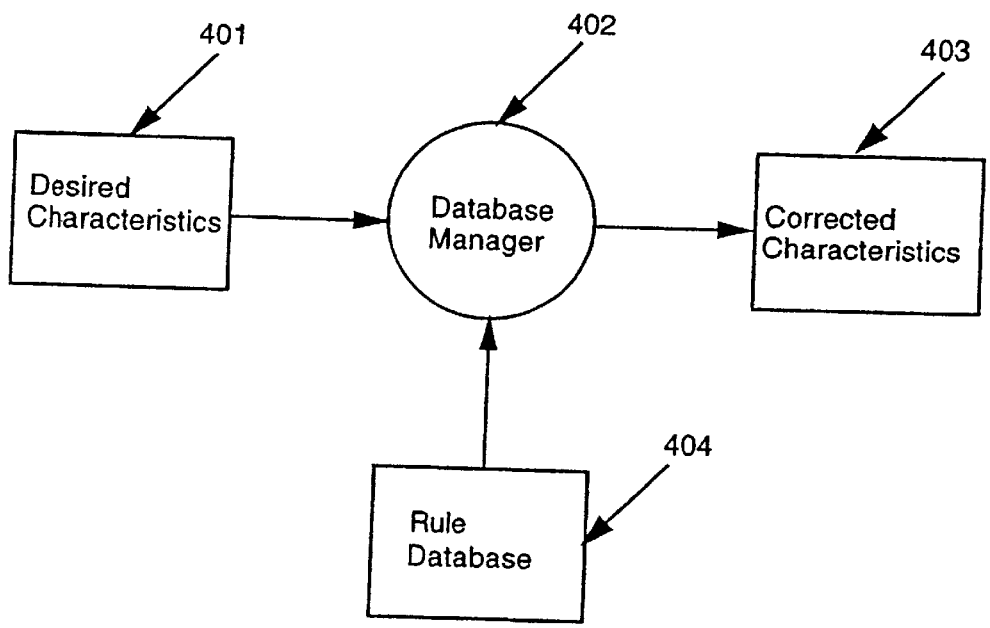
FIG. 4 is a block schematic diagram of the basic functionality of the database manager module according to the invention.

With respect to FIG. 4, a database manager module is provided 402. The database manager 402 applies the set of rules in the rule database 404 to desired characteristics 401 that the user inputs. Any desired characteristics that are not available or feasible in the target system are replaced with characteristics that do make sense with respect to the target system. The output from the database manager 402 is a corrected or constrained set of characteristics 403.

The modularity of the database manager and the rule database allows the two components to be used as a front-end to a target system or installed in a product internally.

Figure 5:
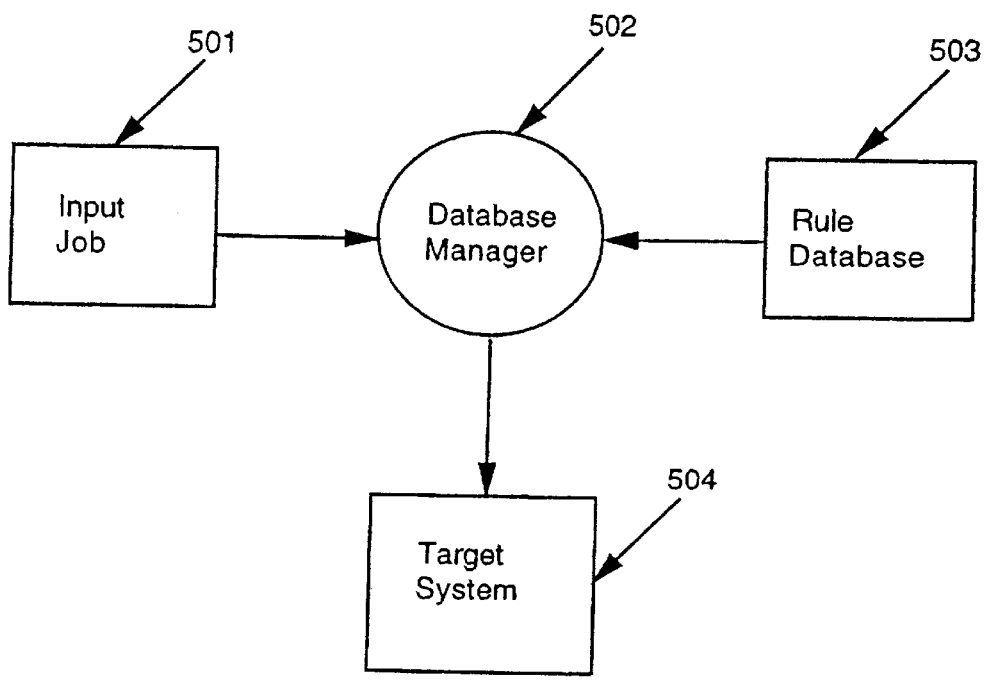
FIG. 5 is a block schematic diagram of the database manager module acting as a front-end input processor to a target system according to the invention.

Referring to FIG. 5, the database manager 502 and rule database 503 are used as a front-end filter to a target system 504. The database manager 502 accepts input jobs or user choices 501 and provides corrected input to the target system 504.

Figure 6:
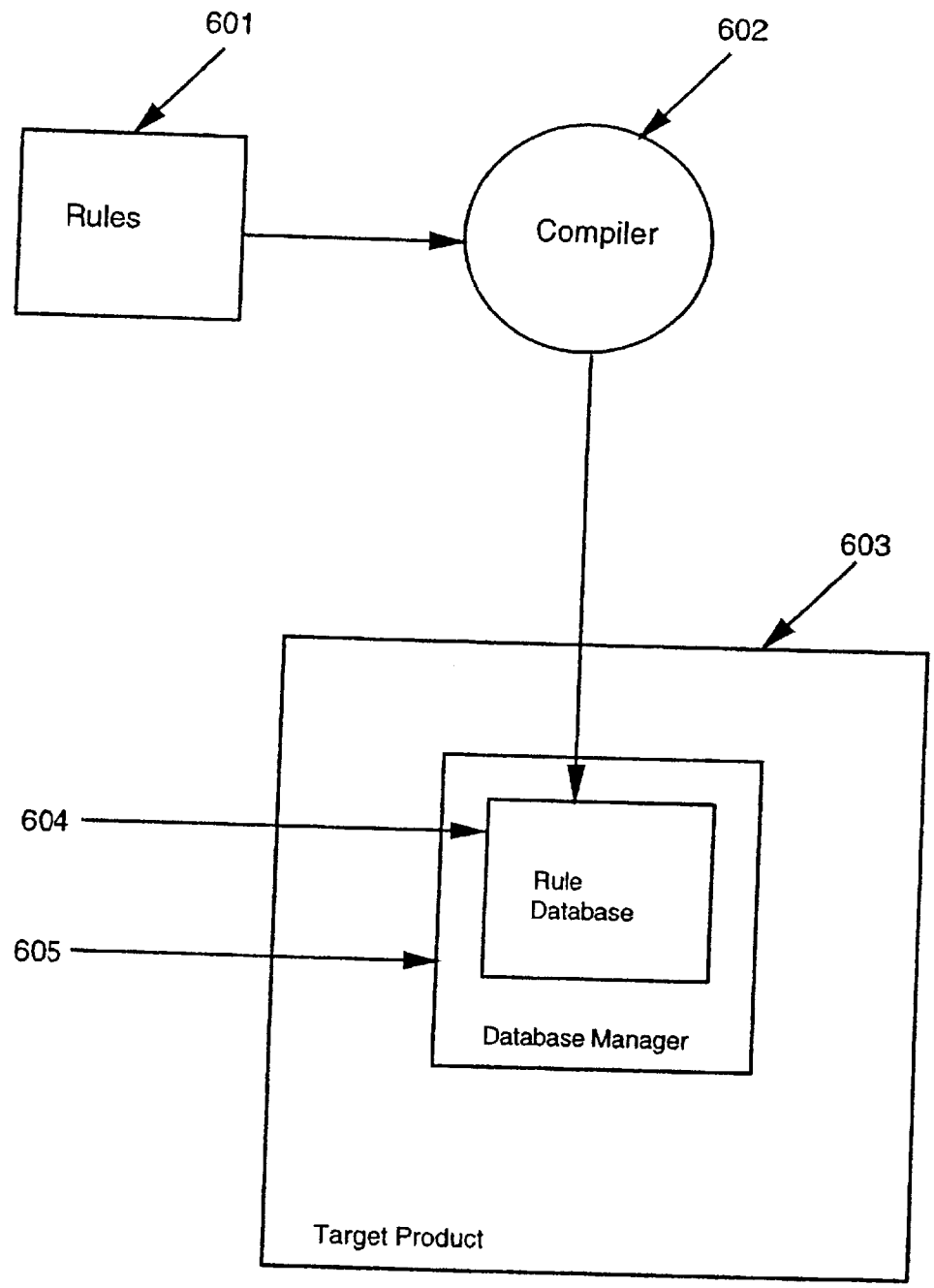
FIG. 6 is a block schematic diagram of a rule database inserted directly into a product according to the invention.

With respect to FIG. 6, once the rule set 601 has been compiled with the compiler module 602, the rule database 604 is installed directly into the target product 603. The product 603 uses the database manager module 605 to access the rule database 604.

A further explanation of the language provided and an example of an application of the invention to a printing system follows:

The Configuration Description Language (CDL) Database

Two sets of parameters can be attributed to a Page Description Language (PDL) system. Some are user-configurable. For example, PDL color model (CMYK, RGB, Grey, etc.) and media type are such parameters. Such parameters are referred to as base. Other parameters selected depending on values of base parameters, are called derived parameters. Examples are: a particular choice of halftone screen or a color rendering dictionary.

The CDL database defines a relationship between base and derived parameters. It is conceptually a table that has two sets of columns—one for base and one for derived parameters. Here is an example of such a table:

| color model | resolution | media type | rendering | crd |
|---|---|---|---|---|
| cmyk | 400 | transparency | contone | crd_s_t |
| cmyk | 400 | normal | contone | crd_s_n |
| cmyk | 600 | transparency | contone | crd_s_t |
| cmyk | 600 | normal | contone | crd_s_n |
| rgb | 400 | transparency | contone | crd_a_t |
| rgb | 400 | normal | contone | crd_a_n |
| rgb | 600 | transparency | halftone | crd_a_t |
| rgb | 600 | normal | halftone | crd_a_n |

Where: crd = color rendering dictionary

The following terminology is used:

Option Type—is used to refer to parameters. Color Model is an Option Type. Option Types go into the heading row in the table above.

Option Type Class—tells whether a parameter is base or derived. For example, Color Model belongs to base Option Type Class. Option Types on the left of a vertical separator in the table above are base ones, derived ones are on the right.

Option—is one of the possible values a particular type of a parameter may take. CMYK is an Option. Options occupy individual cells of the table above.

Option Range—is a list of Options. Curly braces are used to denote Option Ranges. For example {CMYK RGB} is a range of Color Model Option Type.

Rule—is a an association between a set of base options and a set of derived options they select. A row in the table above is an example of a rule.

The CDL provides a mechanism for developing sets of rules for use in EFI printing systems.

The following are the objectives for CDL:

Portability. The tools and files should be portable between PDL systems, controller architectures and development environments.

Run Time System Speed and Compactness. The facility should be both fast and undemanding on system resources.

Ease of Use. The system should be easy to learn. Configurations should be easily understood and maintained.

Robustness. The facility should help reduce the chance for developing bad configurations.

The CDL Approach

A custom database of rules is created. It does not try to describe an algorithm for choosing derived parameters, rather it lists all possible combinations of base parameters and decides how derived parameters should be chosen for each combination. To reduce redundancy in this description not one but several tables are created. For example, relationships listed in the table above could also be described using following two tables:

| color model | resolution | rendering | media type | color model | crd |
|---|---|---|---|---|---|
| cmyk | 600 | contone | transparency | cmyk | crd_s_t |
| rgb | 600 | halftone | transparency | rgb | crd_a_t |
| cmyk | 400 | contone | normal | cmyk | crd_s_n |
| rgb | 400 | contone | normal | rgb | crd_a_n |

To make this task as simple as possible, a custom language for describing rules is provided. A compiler for the language is also provided, which is responsible for verifying validity of the database and converting it into a portable, compact and easy to search format.

There is also a library of C routines that allows access to the database from a printing system. The printing system uses character strings to refer to Option Types and Options.

The CDL Language

The grammar of the language is quite similar to that of C. Of course, since it does not describe algorithms it is much smaller. However, style of comments, #include directive, case-sensitivity, semicolons used as separators, curly braces used to open and close scopes, quoted literal strings, style of declarations will all be familiar to a C programmer.

This language does not describe variables or functions, nor does it produce any executable code. Instead it deals with Option Types, Options, Option Ranges and Tables of Rules.

For example, say that on a particular printer there are the following base option types: ColorModel and MediaType. The CDL language for that would be:

type base ColorModel, MediaType;

The derived option types are likewise declared by the following statement:

//declare derived types type derived CrdFile;

Note the use of the double-slash comment delimiter in the statement above.

So what is the grammatical meaning of CrdFile or ColorModel? They are language identifiers. When the user wants to refer to a derived option type CrdFile he can use identifier CrdFile and the compiler will know what it represents. This becomes useful when the user needs to specify possible values of an Option Type:

```
/*
 * now let's list all possible options
 */
option ColorModel CMYK;
option ColorModel RGB;
option MediaType Transparency, Normal, Thick, Crumpled;
```

C style comments are also valid.

What is implicit in the above examples is that each Option Type or Option has a literal value. By default, the literal value is the same as the text of identifier, but it can also be supplied explicitly:

option CrdFile crdCmyk="CMYK", crdRgb="RGB";

The literal values do not have to be unique across different Option Types. This is an important distinction. The compiler needs to tell by the text of an identifier what it represents—a type, an option, etc. The product using the database may require that both the crd file selection and the PostScript Color Model are called RGB. Existence of the explicit literal property allows both requirements to co-exist.

The listing of rules associating base and derived options is next. First, we need to describe which option types go into the table.

form SampleTable { ColorModel MediaType:CrdFile }

Then the table itself.

```
table SampleTable
{
rule {CMYK Transparency : crd_s_t }
rule {RGB Normal : crd_s_t }
}
```

Every rule must be complete. That means that for each Option Type listed in the form there should be an option of that type listed in the rule.

Since the tables are named, one can open a table scope more than once. The table can be further defined by adding the following code to the same CDL file:

```
table SampleTable
{
rule {CMYK {Normal Thick Crumpled} : crd_s_n }
}
```

Note, that the last example introduces a useful feature of the CDL—ranges. The {Normal Thick Crumpled} passage is an Option Range. The benefit is obvious: rather than define three rules, only one is needed using this technique. The CDL has more ways to simplify the process of developing PDL configurations.

Other Ways to Simplify Development of PDL Configurations using CDL

The option type MediaType mentioned above can be very large. Even using ranges does not completely remove the tedium of repeating long lists of options over and over again. Aliases can help:

alias NormalMedia {Thick, Thin, Crumpled, stock56 };

Now NormalMedia can be used instead of the long and unwieldy range.

```
table SampleTable
{
rule {RGB NormalMedia:crd_s_x }
}
```

But what if a certain rule cannot quite take advantage of an alias that you've developed because in this particular case the range includes one more option? Aliases work everywhere where options or option ranges work, so it is all right to say:

table SampleTable
{
rule {Grey {NormalMedia Transparency} : crd_s_y }
}

However, the language has an even more powerful tool to deal with such situation—a template.

Templates

A template is similar to a rule in its format, however, unlike rules, templates do not have to be complete, and they are named:

table SampleTable
{
template Basic {{RGB CMYK} NormalMedia} : }
rule template Basic {: crd_s_y}
rule template Basic {-RGB +Gray Transparency : crd_s_z}
}

The last example demonstrates how one template can be used to create several rules that have common features. Note the use of + and − signs to add and remove options of a particular type to what is implied by the template. Note also that the add operation is explicit, so that it would be more difficult to have a wrong assumption about what a template contains.

One can build a template from scratch, but sometimes it is helpful to start from another template:

template LessBasic : Basic {+FunkyMedia : crd_s_zz}

An existing template can be altered:

template Basic:Basic {−Crumpled+FunkyMedia : }

Defaults

Default selections for base option types may be specified using the syntax exemplified below:

default ColorMode=CMYK, MediaType=Normal;

All base options are set to their defaults as given in default statements. If no default is given explicitly, the first option defined for a given type is assumed as a default one.

A Sample CDL Source File

/* CB specification for clc700.
*/
/* Base types
*/
type base ColorMode;
type base MediaType;
type base RenderingIntent;
/* Derived types
*/
type derived Calibration;
type derived CRDName;
/* both base and derived types
*/
type derived base HalftoneMode;
/* Options
*/
option ColorMode CMYK, RGB, Grayscale;
option HalftoneMode Contone, Halftone;
option MediaType Plain, Transparent;
option RenderingIntent Monitor, Photographic, Presentation, Solid;
option Calibration CMYKContone, CMYKHalftone, RGBContone;
option CRDName CMYKPlainMonitor, CMYKPlainPhotographic,
CMYKPlainPresentation,
CMYKTransparentMonitor,
CMYKTransparentPhotographic,
CMYKTransparentPresentation,
CMYKTransparentSolid,
RGBPlainMonitor, RGBPlainPhotographic,
RGBPlainPresentation, RGBPlainSolid,
RGBTransparentMonitor, RGBTransparentPhotographic,
RGBTransparentPresentation, RGBTransparentSolid;
form HalftoneTable {ColorMode HalftoneMode : HalftoneMode }
table HalftoneTable
{
rule { { CMYK RGB Grayscale } Contone : Contone }
rule { CMYK Halftone : Halftone }
rule { { RGB Grayscale } Halftone : Contone }
}
form CalibrationTable { ColorMode HalftoneMode : Calibration }
table CalibrationTable
{
rule { { CMYK Grayscale } Contone : CMYKContone }
rule { {CMYK Grayscale} Halftone : CMYKHalftone }
rule { RGB { Contone Halftone } : RGBContone }
}
form CRDNameTable { ColorMode MediaType RenderingIntent : CRDName }
table CRDNameTable
{
rule { { CMYK Grayscale } Plain Monitor : CMYKPlainMonitor }
rule { { CMYK Grayscale } Plain Photographic : CMYKPlainPhotographic }
rule { { CMYK Grayscale } Plain Presentation : CMYKPlainPresentation }
rule { { CMYK Grayscale } Plain Solid : CMYKPlainPresentation }
rule { { CMYK Grayscale } Transparent Monitor : CMYKTransparentMonitor }
rule { CMYK Grayscale } Transparent Photographic : CMYKTransparentPhotographic }
rule { { CMYK Grayscale } Transparent Presentation : CMYKTransparentPresentation }
rule { { CMYK Grayscale } Transparent Solid : CMYKTransparentSolid }
rule { RGB Plain Monitor : RGBPlainMonitor }
rule { RGB Plain Photographic : RGBPlainPhotographic }
rule { RGB Plain Presentation : RGBPlainPresentation }
rule { RGB Plain Solid : RGBPlainSolid }
rule { RGB Transparent Monitor : RGBTransparentMonitor }
rule { RGB Transparent Photographic : RGBTransparentPhotographic } rule { RGB Transparent Presentation : RGBTransparentPresentation }
rule { RGB Transparent Solid : RGBTransparentSolid }
}

Option Types That are Both Base and Derived

There is a declaration in the sample above:
type derived base HalftoneMode;
It is possible to declare a particular option type to belong to a base and derived class at the same time. Such a classification may be necessary when a product has to allow a printer user to request illegal combinations of base parameters. For example, a CLC700 product does not support a combination of RGB Color Model with Halftone Resolution. When the user makes such selection, the printing system chooses Contone Option instead.

The way the CDL database manager handles these special types is as follows:

When a printing system submits an option selection for derived/base Option Type, it is accepted.

The tables are then evaluated in the same order in which they were read by the compiler and the derived value for Option Type in question is selected.

When a printing system inquires a selected value for this Option Type, the derived value as chosen in a procedure above is returned.

For example, for the sample CDL file presented above, the printing system submits the following base option selections: RGB, Plain, Halftone, Monitor. The database manager evaluates the HalftoneTable table first. It will find that the last rule in the table applies to both the RGB and Halftone selections. The rule will override the user's selection for resolution to Contone. Consequent evaluation of the two remaining tables (CalibrationTable and CRDNameTable) will be successful. The resulting set of derived options will be: RGBPlainMonitor, RGBContone, Contone.

CDL Report Tool

The invention provides a report tool. It produces a table that lists all possible combinations of base options and corresponding selections of derived ones. The table is formatted with HTML tags, so the user can print it using an Internet browser. An example of a table output from the report tool, using the CDL file above, follows:

| Color Mode | Halftone Mode | Media Type | Rendering Intent | CRD Name | Calibration | Halftone Mode |
|---|---|---|---|---|---|---|
| CMYK | Contone | Plain | Monitor | CMYKPlainMonitor | CMYKContone | Contone |
| CMYK | Contone | Plain | Photographic | CMYKPlainPhotographic | CMYKContone | Contone |
| CMYK | Contone | Plain | Presentation | CMYKPlainPresentation | CMYKContone | Contone |
| CMYK | Contone | Plain | Solid | CMYKPlainPresentation | CMYKContone | Contone |
| CMYK | Contone | Transparent | Monitor | CMYKTransparentMonitor | CMYKContone | Contone |
| CMYK | Contone | Transparent | Photographic | CMYKTransparentPhotographic | CMYKContone | Contone |
| CMYK | Contone | Transparent | Presentation | CMYKTransparentPresentation | CMYKContone | Contone |
| CMYK | Contone | Transparent | Solid | CMYKTransparentSolid | CMYKContone | Contone |
| CMYK | Halftone | Plain | Monitor | CMYKPlainMonitor | CMYKHalftone | Halftone |
| CMYK | Halftone | Plain | Photographic | CMYKPlainPhotographic | CMYKHalftone | Halftone |
| CMYK | Halftone | Plain | Presentation | CMYKPlainPresentation | CMYKHalftone | Halftone |
| CMYK | Halftone | Plain | Solid | CMYKPlainPresentation | CMYKHalftone | Halftone |
| CMYK | Halftone | Transparent | Monitor | CMYKTransparentMonitor | CMYKHalftone | Halftone |
| CMYK | Halftone | Transparent | Photographic | CMYKTransparentPhotographic | CMYKHalftone | Halftone |
| CMYK | Halftone | Transparent | Presentation | CMYKTransparentPresentation | CMYKHalftone | Halftone |
| CMYK | Halftone | Transparent | Solid | CMYKTransparentSolid | CMYKHalftone | Halftone |
| Grayscale | Contone | Plain | Monitor | CMYKPlainMonitor | CMYKContone | Contone |
| Grayscale | Contone | Plain | Photographic | CMYKPlainPhotographic | CMYKContone | Contone |
| Grayscale | Contone | Plain | Presentation | CMYKPlainPresentation | CMYKContone | Contone |
| Grayscale | Contone | Plain | Solid | CMYKPlainPresentation | CMYKContone | Contone |
| Grayscale | Contone | Transparent | Monitor | CMYKTransparentMonitor | CMYKContone | Contone |
| Grayscale | Contone | Transparent | Photographic | CMYKTransparentPhotographic | CMYKContone | Contone |

-continued

| Color Mode | Halftone Mode | Media Type | Rendering Intent | CRD Name | Calibration | Halftone Mode |
|---|---|---|---|---|---|---|
| Grayscale | Contone | Transparent | Presentation | CMYK TransparentPresentation | CMYKContone | Contone |
| Grayscale | Contone | Transparent | Solid | CMYK TransparentSolid | CMYKContone | Contone |
| Grayscale | Halftone | Plain | Monitor | CMYKPlain Monitor | CMYKContone | Contone |
| Grayscale | Halftone | Plain | Photographic | CMYKPlain Photographic | CMYKContone | Contone |
| Grayscale | Halftone | Plain | Presentation | CMYKPlain Presentation | CMYKContone | Contone |
| Grayscale | Halftone | Plain | Solid | CMYKPlain Presentation | CMYKContone | Contone |
| Grayscale | Halftone | Transparent | Monitor | CMYK TransparentMonitor | CMYKContone | Contone |
| Grayscale | Halftone | Transparent | Photographic | CMYK TransparentPhotographic | CMYKContone | Contone |
| Grayscale | Halftone | Transparent | Presentation | CMYK TransparentPresentation | CMYKContone | Contone |
| Grayscale | Halftone | Transparent | Solid | CMYK TransparentSolid | CMYKContone | Contone |
| RGB | Contone | Plain | Monitor | RGBPlain Monitor | RGBContone | Contone |
| RGB | Contone | Plain | Photographic | RGBPlain Photographic | RGBContone | Contone |
| RGB | Contone | Plain | Presentation | RGBPlain Presentation | RGBContone | Contone |
| RGB | Contone | Plain | Solid | RGBPlainSolid | RGBContone | Contone |
| RGB | Contone | Transparent | Monitor | RGB TransparentMonitor | RGBContone | Contone |
| RGB | Contone | Transparent | Photographic | RGB TransparentPhotographic | RGBContone | Contone |
| RGB | Contone | Transparent | Presentation | RGB TransparentPresentation | RGBContone | Contone |
| RGB | Contone | Transparent | Solid | RGB TransparentSolid | RGBContone | Contone |
| RGB | Halftone | Plain | Monitor | RGBPlain Monitor | RGBContone | Contone |
| RGB | Halftone | Plain | Photographic | RGBPlain Photographic | RGBContone | Contone |
| RGB | Halftone | Plain | Presentation | RGBPlain Presentation | RGBContone | Contone |
| RGB | Halftone | Plain | Solid | RGBPlainSolid | RGBContone | Contone |
| RGB | Halftone | Transparent | Monitor | RGB TransparentMonitor | RGBContone | Contone |
| RGB | Halftone | Transparent | Photographic | RGB TransparentPhotographic | RGBContone | Contone |
| RGB | Halftone | Transparent | Presentation | RGB TransparentPresentation | RGBContone | Contone |
| RGB | Halftone | Transparent | Solid | RGB TransparentSolid | RGBContone | Contone |

One skilled in the art will readily appreciate that, although printing systems are specifically mentioned, the invention applies equally to other computing systems such as state machines or rule-based systems.

Figure 7:
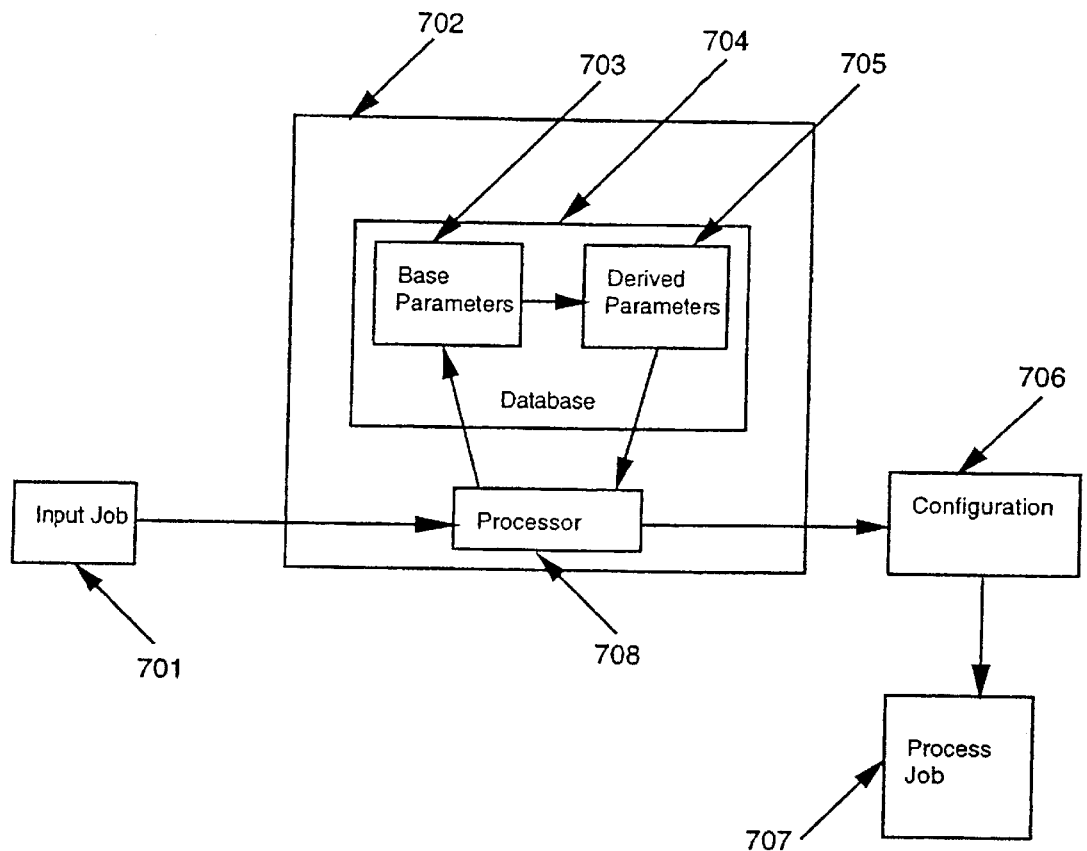
FIG. 7 is a block schematic diagram of a printing system using the database manager as an input job filter according to the invention.

Referring to FIG. 7, a printing system 702 as shown above processes input print jobs 701. The processor 708 accesses the database through the database manager 704. The database manager 704 correlates the base parameters 703 with the preferred characteristics from the input job 701. The values of the derived parameters 705 are determined using the rules defined for the printing system and the desired characteristics from the input job 701. Once all of the desired characteristics from the input job 701 are corrected, the configuration file 706 containing the corrected characteristics is output from the system 702. The job with the correct characteristics is then processed 707 by the printer.

The result is that the job is printed rather than being rejected because of invalid characteristics selected by the user. The invention corrects input automatically. Any combination of input can be understood and converted once the constraints or rules are defined. The invention works with any computing system that can be described in a closed set or defined space.

Figure 8:
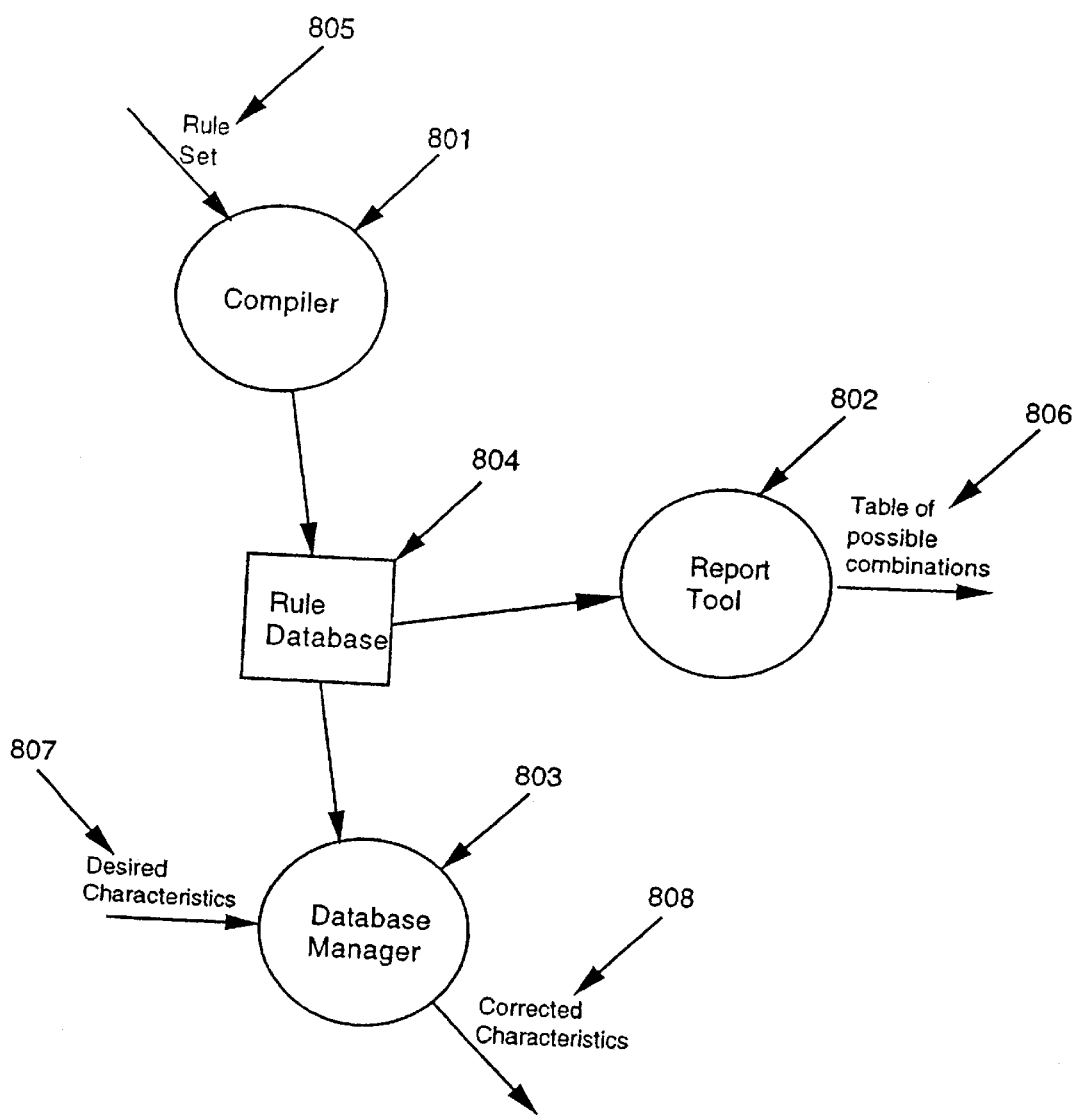
FIG. 8 is a block schematic diagram of a task-oriented view of the relationship between the modules of the invention according to the invention.

With respect to FIG. 8, a task-oriented view of the relationship between the component modules is represented. The compiler module 801 accepts rules sets 805, compiles the rule sets and creates a rule database 804. The report tool module 802 reads the rule database 804 and outputs a table containing all of the possible characteristic combinations 806 according to the rules. The database manager module 803 accepts as input, desired sets of characteristics 807. The database manager module 803 applies the rules in the rule database 804 to the desired characteristics 807 and outputs a set of corrected characteristics 808.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

What is claimed is:

1. A configuration-management system, comprising:

a configuration-description language comprising base parameters which are user-configurable and derived parameters which depend from said base parameters;

a target system having a limited set of selectable functions and that constrains relationships between said base and derived parameters;

a compiler for generating a plurality of rule sets using said configuration-description language by verifying input-definition validity, wherein system definitions are converted into a portable, compact binary format;

a rule database for storing said plurality of rule sets in binary format and including a predetermined table of all possible characteristics combinations for the target system;

a database manager for providing a constrained set of choices to the target system after first applying said plurality of rule sets to an input job, and further providing for a replacement selection of functions in the target system when said input job includes otherwise infeasible choices; and a report tool for verifying a system constraint parameter to a user, and providing for a traversal of any rules sets and for creating a table of all possible combinations of options or characteristics of the target system;

wherein, release-engineering maintainability is improved by an accurate reproduction of any prior configuration releases of the target system.

2. The system of claim 1, wherein:

the database manager and rule database are configured as a front-end filter for the target system, and the database manager receives any input jobs and user choices.

3. The system of claim 1, wherein:

the configuration-description language can be described in pseudo-Backus-Naur-Form (BNF), as follows:

```
The keywords of the language are:

K_ALIAS     alias
K_BASE      base
K_DEFAULT   default
K_DERIVED   derived
K_FORM      form
K_OPTION    option
K_RULE      rule
K_TABLE     table
K_TEMPLATE  template
K_TYPE      type Two additional tokens used in BNFs are described below
in terms of lex semantics:

T_QSTR (\"[^\"\r\n]*[\"\r\n])
T_ID   ([[:alpha:]_][[:alnum:]_]*)
file
    :/* nothing */
    |statement_list
    ;
statement_list
    :statement
    |statement_list statement
    ;
statement
    :K_TABLE known_id
     '{' opt table_decl_list '}'
    |K_FORM new_id '{' typelist ':' typelist '}'
    |K_TYPE K_BASE id_decl_list';'
    |K_TYPE K_DERIVED K_BASE id_decl_list';'
    |K_TYPE K_DERIVED id_decl_list';'
    |K_ALIAS new_id option';'
    |K_OPTION known_id id_decl list';'
    |K_DEFAULT known_id_pair_list';'
    ;
opt_table_decl_list
    :/*nothing*/
    |table_decl_list
    ;
table_decl_list
    :table_decl
    |table_decl_list table_decl
    ;
table_decl
    :K_RULE rule_body
    |K_RULE K_TEMPLATE table_known_id rule_body
    |K_RULE K_TEMPLATE table_known_id';'
    |K_TEMPLATE table_local_id rule_body
    |K_TEMPLATE table_local_id ':' table_known_id
rule_body
    ;
rule_body
    :'{' opt_option_op list ':' opt_option_op_list '}'
    ;
option
    :'{' known_id_list '}'
    |known_id
    ;
opt_option_op_list
    :/*empty*/
    |option_op_list
    ;
option_op_list
    :option_op
    |option_op_list option_op
    ;
option_op
    : '+' option
    |option
    | '-' option
    ;
id_decl_list
    :id_decl
    |id_decl_list';'id_decl
    ;
known_id_list
    :known_id
    |known_id_list known_id
    ;
known_id_pair
    :known_id '=' known_id
known_id_pair_list
    :known_id_pair
    |known_id_pair_list ',' known_id_pair
    ;
type_list
    :known_id
    |type_list known_id
    ;
id_decl
    :new_id
    |new_id '=' T_QSTR
    ;
new_id
    :T_ID
    ;
known_id
    :T_ID
    ;
table_known_id
    :T_ID
    ;
table_local_id
    :T_ID
    ;
```

4. The system of claim 1, wherein:

the compiler receives said plurality of rule sets created by said system designer from target system definitions, and validates any said base and derived parameters for completeness, and if any inconsistencies or errors exist, the compiler provides for a notification of said system designer with an error message, otherwise the compiler creates a binary form of the rule set in the rule database.

5. The system of claim 1, wherein:

the report tool provides for system designer verification of said parameters, and traverses all rule sets in the rule database, and it further provides for a table of all possible combinations of options or characteristics of the target system to be created.

6. The system of claim 1, wherein:

the compiler and report tool provide for said system designer to verify a design, including starting with any system requirements of the target system to recursively (a) define a rule set, (b) compile said rule set, and (c) correct said rule set.

7. The system of claim 1, wherein:

the report tool provides for the generating of a table of all possible combinations of base options and corresponding selections of derived ones, and said table is formatted by the report tool to include hypertext markup language (HTML) tags that allow said user to print it with an Internet browser.

8. The system of claim 1, wherein:

the compiler accepts rules sets, compiles the rule sets and creates a rule database;

the report tool reads the rule database and outputs a table containing all possible characteristic combinations according to the rule sets; and the database manager accepts desired sets of characteristics 807 and applies the rule sets in the rule database to output a set of corrected characteristics.

9. A printing system method for processing input-print jobs, comprising:

inputting an input-print job to a printing system;

accessing a database through a database manager that correlates any base parameters with a preferred characteristic from said input-print job;

determining values of any derived parameters by using a set of rules defined for a printing system and a set of desired characteristics from said input-print job;

correcting all said desired characteristics in said input-print job; and outputting a configuration file including any corrected characteristics from said printing system for further processing by a printer;

wherein, said input-print job is printed rather than being rejected for any invalid characteristics that may have been selected by a user.

* * * * *